DECADE TYPE TUNING MECHANISM

Filed July 26, 1954 2 Sheets-Sheet 1

ALFRED A. HEMPHILL
JOHN M. TEWKSBURY
*INVENTOR.*

BY

*Hillman and Kerst*
ATTORNEYS

ALFRED A. HEMPHILL
JOHN M. TEWKSBURY
*INVENTOR.*

*BY*
*Killman and Kerst*
ATTORNEYS

United States Patent Office 2,856,780

Patented Oct. 21, 1958

2,856,780

DECADE TYPE TUNING MECHANISM

Alfred A. Hemphill, Baltimore, and John M. Tewksbury, Lutherville, Md., assignors to Bendix Aviation Corporation, Towson, Md., a corporation of Delaware Application July 26, 1954, Serial No. 445,816

2 Claims. (Cl. 74—10.45)

Figure 1:
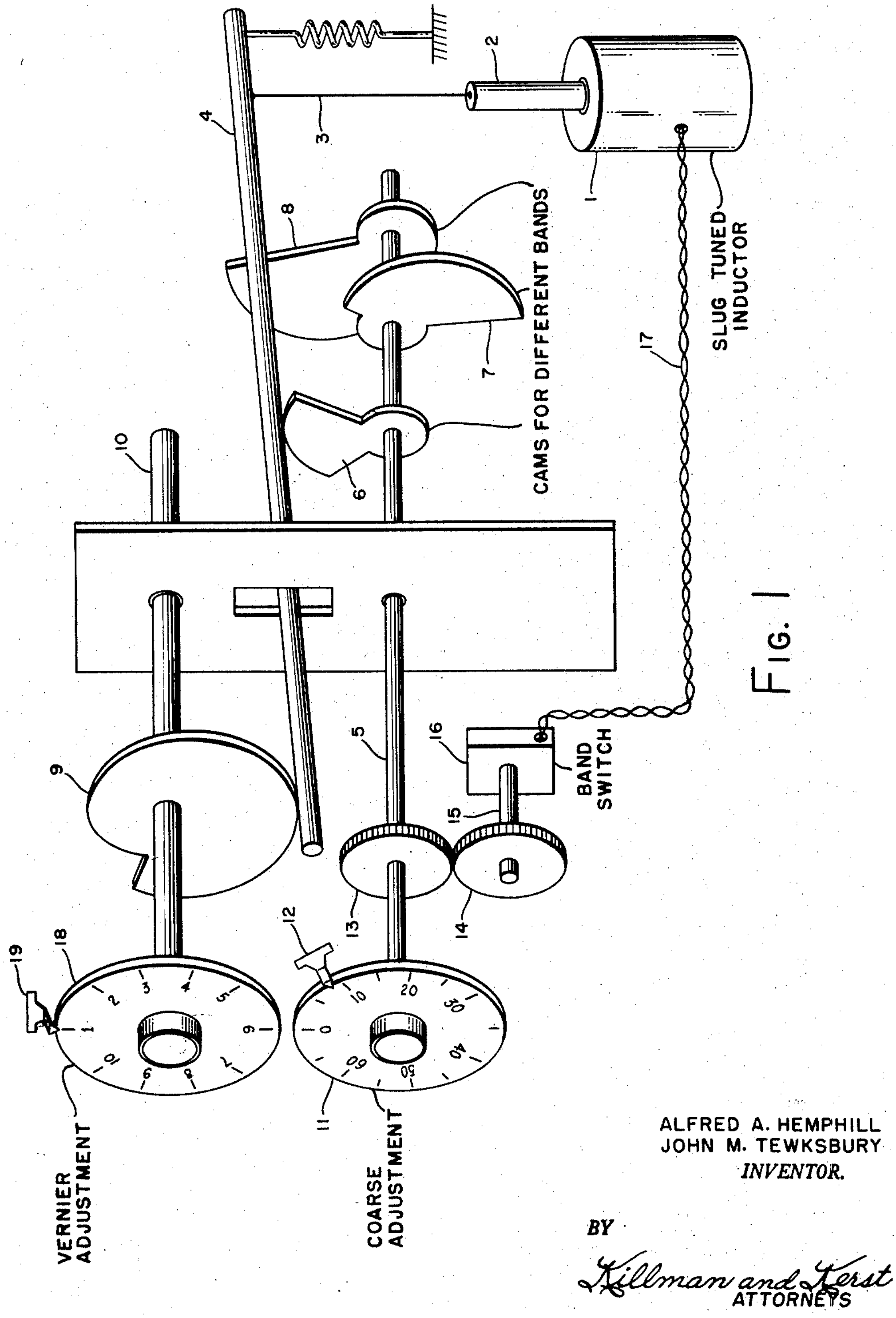

The present invention provides an adjustable controlling mechanism and in particular, an adjustable controlling mechanism for use in a tuning device.

In the past, to provide a band-changing tuning system to encompass a relatively broad range of frequencies, it has been necessary to use a number of switchable coils and capacitors. Reducing the number of bands so as to economize on the number of components, but maintaining the total range of frequencies, produces a system which is not adaptable to decade tuning. The present invention provides an adjustable controlling mechanism for use with a tuning device such that a system may be produced that will permit fine tuning in a decade fashion over a broad band of frequencies.

It is therefore an object of the present invention to provide an adjustable controlling mechanism for use in a tuning device.

Another object of the present invention is to provide an adjustable controlling mechanism for use in a tuning device such that decade tuning may be accomplished.

A further object is to provide an adjustable controlling mechanism for use in a tuning device to eliminate components while maintaining desirable features.

A still further object is to provide an adjustable controlling mechanism for use with a tuning device to provide a compact tuning system.

These and other objects are present in the illustrated system which encompasses the invention. In this system a cam operated lever is used to apply motion to a tuning device. The fulcrum of the lever is adjustable through the use of a plurality of cams which are employed to provide a plurality of fulcrum positions that are perpendicularly and longitudinally displaced with respect to a fixed line parallel to a reference position of the axis of the lever. The various fulcrum positions thus provided permit a uniform frequency change to be effected by a given movement of the end of the cam operated lever remote from the tuning device, anywhere within the total frequency range of the tuning device.

Figure 2:
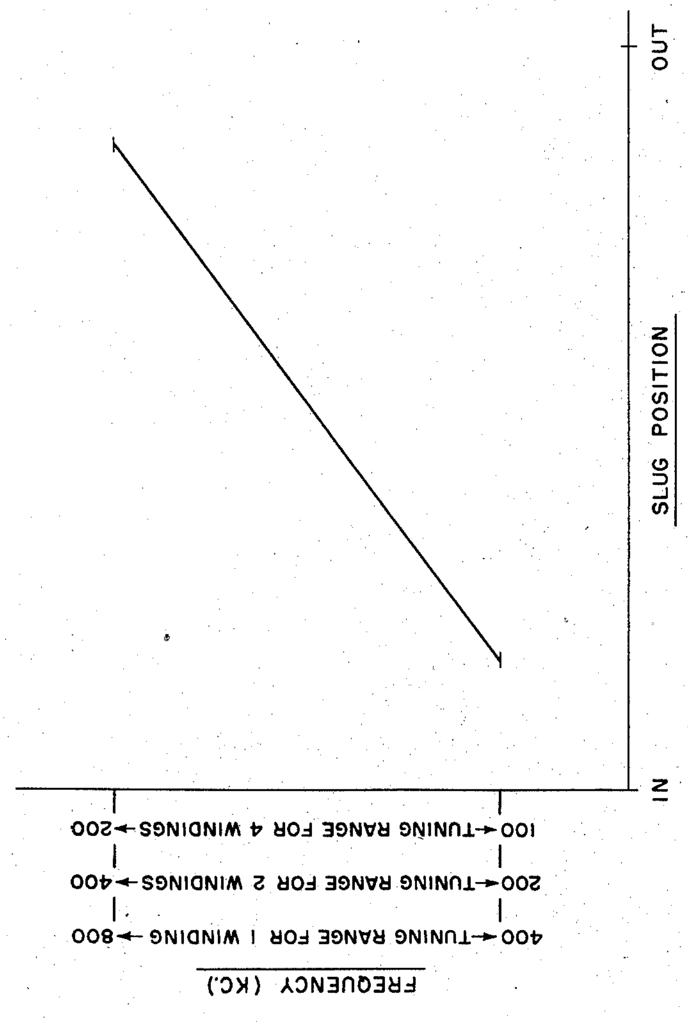

Referring to the drawings:

Fig. 1 depicts a tuning system which illustrates an embodiment of the invention; and Fig. 2 is a graph of frequency vs. slug position response for the tuning device of Fig. 1.

Referring to Fig. 1 in particular, a tuning system is depicted which illustrates a particular application of the invention. The tuning device employed is of the permeability type comprising a coil 1 and a slug 2. One extremity of a linkage 3 is connected to the slug 2 for imparting motion thereto. The remaining extremity of the linkage 3 is connected to one extremity of a lever 4. A shaft 5 is positioned such that its center line lies in a plane defined by the motion of shaft 4 which is the same plane as that in which the center line of the lever 4 lies for all positions of the lever 4. The shaft 5 has mounted thereon a plurality of cams 6, 7 and 8. A cam 9 and a dial 18 are mounted on a shaft 10 such that motion applied to the dial 18 will cause the lever 4 to move. A pointer 19 indicates the position of the cam 9. The cams 6, 7, 8 are so arranged on the shaft 5 that various predetermined rotational positions of the shaft 5 will provide predetermined fulcrums for the lever 4. These fulcrums will be dispersed longitudinally and perpendicularly with respect to the shaft 5, but in the aforementioned plane. Each fulcrum will determine the degree of motion imparted to and the limits of travel of the slug 2 for a given degree of rotation of the cam 9.

A dial 11 and a pointer 12 are provided for indicating the fulcrums. A gear 13, meshing with a gear 14 imparts rotational motion to a shaft 15. The shaft 15 activates a switching device 16 to which are connected leads 17 of the windings of the coil 1.

For the purpose of illustrating the operation of the mechanism in conjunction with the tuning device depicted in Fig. 1, assume that the coil 1 consists of combinations of four windings so wound on the coil form that the individual electrical characteristics thereof are identical. If two of these windings are series-aiding connected, the total inductance will be equal to $L+L+2M$, where L is the individual inductance of the windings and M is the mutual coupling therebetween. In this particular arrangement of the windings, M approximately equals L. Therefore, it is obvious that for two windings, series-aiding connected, the total inductance will be 4L. For three of the windings, series-aiding connected, the inductance will be 9L while it will be 16L for four windings.

It is well known in the art that the resonant frequency of a tuned circuit is an inverse function of the square root of the product of the capacitance and the inductance of the components thereof. Therefore, if the capacitance is held constant, the resonant frequency will be halved by replacing a single winding of the coil 1 with a serially connected pair of these windings. Likewise, replacing the pair of serially connected windings with four serially connected windings will cause a further reduction of 2 to 1 in the resonant frequency.

To further illustrate the operations of the mechanism, assume the slug 2 and the individual windings of the coil 1 are so designed that the linear portion of the resonant frequency vs. slug position curve for a single winding, in conjunction with an appropriate capacitor to form a tuned circuit, will provide a frequency range of 400 to 800 kc. Therefore, with two of the windings series-aiding connected, the frequency range will be 200 to 400 kc. for the same linear portion of the curve, and with four of the windings series-aiding connected, the range will be 100 to 200 kc. Fig. 2 shows a graph of frequency vs. slug position for these ranges.

To provide a uniform vernier tuning range by the rotation of the shaft 10, the degree of motion of the slug 2 produced by the rotation of the shaft 10 must bear a ratio relationship of 4:2:1 to tune over the same vernier range for the frequency ranges of 100 to 200, 200 to 400, and 400 to 800 kc. respectively. This ratio is varied by the horizontally displaced fulcrums provided by the properly positioned cams 6, 7 and 8 respectively. If the vernier tuning range to be provided by the shaft 10 is 10 kc., it is obvious that the cam 6 must provide to cover 100 kc. frequency change ten fulcrums each of which is uniquely displaced from the shaft 5. Likewise, as the range covered by the cam 7 is twice that covered by the cam 6, the cam 7 must provide to cover 200 kc. frequency change twenty fulcrums each of which is uniquely displaced from the shaft 5. Similarly, the cam 8 must provide forty fulcrums, each providing a 10 kc. vernier range or a total of 400 kc. frequency change.

The dials 11 and 18 are marked to indicate the fulcrums and frequency respectively covered for in accordance with the above discussion.

The gears 13 and 14 provide motion to the switch 16 such that as each cam is brought into position to provide its particular set of fulcrums, the various winding connections are made which are necessary to produce the proper coil 1 for the range to be covered.

In the particular system shown, the tuning device used was a permeability tuned coil. The substitution of any other tuning device which will provide similar frequency vs. motion characteristics may be used. Therefore, it is to be understood that the application of the invention is not limited to permeability tuned tuning devices.

What is claimed is:

1. In a tuning system, means for applying reciprocal motion to a tuning element comprising: a first shaft supported for rotational movement only, a first disk cam mounted on said first shaft and having a radius which varies progressively from a minimum to a maximum value for a complete rotation of said shaft, a second shaft mounted for rotational movement only and having its axis parallel to that of said first shaft, a plurality of disk cams mounted at spaced locations on said second shaft, the follower actuating surfaces of said plurality of cams occupying unique angular sectors about said second shaft, a cam follower member spanning said cams of said first and second shafts, said follower member being constrained against movement except in a plane containing the axes of said shafts, means connecting said follower member to said tuning element and means yieldingly urging said follower element into following contact with the actuating surfaces of said cams of said first and second shafts, whereby each of said plurality of cams acts, for a respective sector of rotation of said second shaft, as a fulcrum about which said follower member is pivotally moved by rotation of said first shaft and the coaction therewith of said first cam.

2. In a tuning system, means for applying reciprocal motion to a tuning element comprising: a first shaft supported for rotational movement only, a first disk cam mounted on said first shaft and having a radius which varies progressively from a minimum to a maximum value for a complete rotation of said shaft, a second shaft mounted for rotational movement only and having its axis parallel to that of said first shaft, a plurality of disk cams mounted at spaced locations on said second shaft, the follower actuating surfaces of said plurality of cams occupying unique angular sectors about said second shaft, a cam follower member spanning said cams and extending beyond said plurality of cams, said follower member being located between said shafts and being constrained against movement except in the plane containing the axes of said shafts, means connecting said extending portion of said follower member to said tuning element and means yieldingly urging said follower element into following contact with the actuating surfaces of said cams, said first disk cam and said connecting means being located on opposite sides of said plurality of cams, whereby each of said plurality of cams acts, for a respective sector of rotation of said second shaft, as a fulcrum about which said follower member is pivotally moved by rotation of said first shaft.

References Cited in the file of this patent

UNITED STATES PATENTS

| | | |
|---|---|---|
| 1,727,641 | Grebe | Sept. 10, 1929 |
| 2,572,964 | Wulfsberg | Oct. 30, 1951 |

FOREIGN PATENTS

| | | |
|---|---|---|
| 738,501 | Germany | July 15, 1943 |